# (12) United States Patent
Song et al.

(10) Patent No.: US 10,281,521 B2
(45) Date of Patent: May 7, 2019

(54) SYSTEM FOR THERMAL MANAGEMENT OF DEVICE UNDER TEST (DUT)

(71) Applicant: Intel Corporation, Santa Clara, CA (US)

(72) Inventors: David Won-jun Song, Chandler, AZ (US); James R. Hastings, Chandler, AZ (US); Akhilesh P. Rallabandi, Gilbert, AZ (US); Morten S. Jensen, Messa, AZ (US); Christopher Wade Ackerman, Phoenix, AZ (US); Christopher R. Schroeder, Gilbert, AZ (US); Nader N. Abazarnia, Chandler, AZ (US); John C. Johnson, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 175 days.

(21) Appl. No.: 15/367,415

(22) Filed: Dec. 2, 2016

(65) Prior Publication Data

US 2018/0156863 A1 Jun. 7, 2018

(51) Int. Cl.
*G01R 31/10* (2006.01)
*G01R 31/28* (2006.01)
*H05B 6/10* (2006.01)

(52) U.S. Cl.
CPC .......... *G01R 31/2875* (2013.01); *H05B 6/10* (2013.01)

(58) Field of Classification Search
CPC .......... H01J 37/32724; H01J 37/32935; H01J 37/32522; H01J 37/32577; H01J 2237/24564; H01J 37/04; H01J 37/32816; H01J 37/32889; C12Q 2563/116; C12Q 1/6874; C12Q 2523/307; C12Q 1/6869; C12Q 2527/119; C12Q 2565/543; C12Q 2565/607; C12Q 1/6848; C12Q 1/6853; C12Q 2549/126; C23C 16/4404; C23C 16/45502; G01R 1/0458; G01R 31/2874; G01R 31/2875; G01R 15/04; G01R 15/26; G01R 19/0084; G01R 1/04; G01R 21/14;
(Continued)

(56) References Cited

U.S. PATENT DOCUMENTS 5,269,372 A * 12/1993 Chu ................. F28F 3/12
 165/185
7,030,485 B2 * 4/2006 Houle ............. H01L 23/3736
 257/706
(Continued)

*Primary Examiner* — Vinh P Nguyen
(74) *Attorney, Agent, or Firm* — Schwegman Lundberg & Woessner, P.A.

(57) ABSTRACT

Techniques for thermal management of a device under test are discussed. In an example, an apparatus may include a pedestal having a device-specific surface configured to exchange heat with the integrated circuit while the device-specific surface is in contact with a surface of the integrated circuit or separated from the surface of the integrated circuit by a layer of thermally conductive material, and a heat generating element configured to heat the device-specific surface. In certain examples, the pedestal may include a plurality of channels configured to couple to a manifold and to route thermal material from the manifold through an interior of the pedestal for maintaining temperature control of the surface of an integrated circuit under test.

16 Claims, 10 Drawing Sheets

(58) Field of Classification Search
CPC .......................... G01R 31/2891; G01R 1/0433; G01R 1/0466; G06F 19/00; H02M 1/44; H05B 3/26; H05B 1/0233; H05B 2203/037; H05B 3/267; H05B 6/10
See application file for complete search history.

(56) References Cited

U.S. PATENT DOCUMENTS

| | | | |
|---|---|---|---|
| 7,723,160 B2* | 5/2010 | Houle | H01L 23/3736 438/122 |
| 9,377,486 B2* | 6/2016 | Song | G01R 1/04 |
| 2011/0181313 A1* | 7/2011 | Sasaki | H01L 21/67109 324/750.03 |

* cited by examiner

# SYSTEM FOR THERMAL MANAGEMENT OF DEVICE UNDER TEST (DUT)

TECHNICAL FIELD

The disclosure herein relates generally to managing thermal conditions of a device under test and more particularly to improvements for device-specific pedestals for managing thermal conditions of the device under test.

BACKGROUND

Large form factor server products may have a very high heat dissipation during class test, for example, >400 W per silicon die. When the test starts, and the heat dissipation suddenly jumps from 0 W to full load, the junction temperature of the device under test (DUT) should not increase more than, for example, 15° C. from the baseline test setpoint temperature (e.g., 95-105° C.) to avoid downbinning and yield loss. Current state of the art solutions in test equipment have employed thin ceramic heaters bonded or pressed onto a self-closed micro-channel thermal head, or manifold. Additionally, a device-specific kit called the "pedestal" may be inserted between the thermal head and the device under test (DUT) to act as a space transformer. Such systems may contain three discrete mechanical interface layers of thermal resistance and thermal mass.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present inventors have recognized techniques for controlling and maintaining a thermal condition through solid heat conduction of a device under test to avoid or decrease the susceptibility of downbinning. In certain example, the techniques may minimize thermal resistance and thermal mass of the control components. In certain examples, the techniques may enable testing of both large, high-powered server products and bare-die client products. In certain examples, the techniques may represent cost effective savings over currently available solutions. As used herein, a device-specific surface is a surface that is sized, shaped and possibly contoured to match a surface of a DUT. In the examples discussed herein, the surface of a pedestal designed to contact a DUT may include a device-specific surface.

Figure 1A:
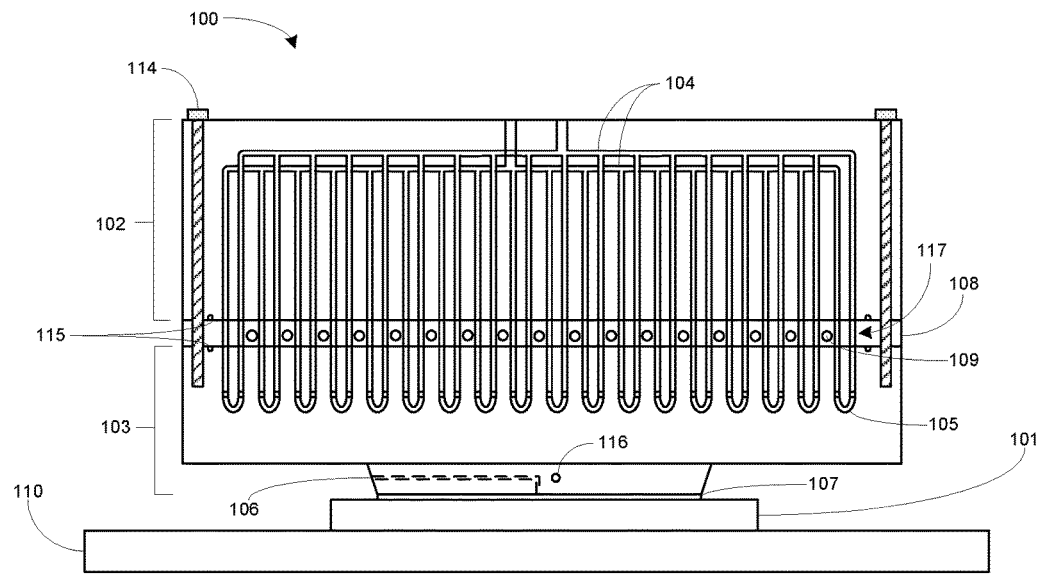
FIGS. 1A-1C illustrate generally example systems for thermal management of a device under test (DUT).

FIG. 1A illustrates generally an example system 100 for thermal management of a device under test (DUT) 101. In certain examples, the system 100 may include a manifold 102 and a pedestal 103. The manifold 102 may include channels 104 or ports for routing thermal materials such as heating or cooling materials or fluids, for example. The heating and cooling materials may be used to transfer heat energy between the assembly of the manifold 102 and pedestal 103 and an external environment. In conventional implementations, the pedestal 103 functions to exchange thermal energy between the DUT 101 and the manifold 102 and to transform the thermal interface area of the DUT 101 to the thermal interface area of the manifold 102. In certain examples, in addition to performing the conventional functions noted above, the pedestal 103 may also include channels 105 or ports to route the heating or cooling materials within the interior of the pedestal 103. The system allows direct contact of cooling fluid and the pedestal, which renders pedestal as a part of the thermal head. The system 100 can both lower thermal resistance and lower thermal mass via fewer thermo-mechanical interface means. Fewer thermo-mechanical interfaces may result in greater DUT-power absorption and quicker compensation of DUT power excursions. Reduction of fluid-to-DUT interfaces may quicken cooling against upward excursions of DUT power (power spike). In certain examples, the reduction of heater-to-DUT interfaces may quicken heating against downward excursions of DUT power (power droop).

In certain examples, the channels 105 of the pedestal 103 may be mated to the channels 104 of the manifold 102 to enable direct thermal modulation of the pedestal 103. In certain examples, the pedestal 103 may include a temperature sensor 116, such as, for example, a thermocouple or a resistance temperature detector (RTD). In some examples, the pedestal 103 may include multiple temperature sensors or temperature sensing elements. In some examples, the pedestal 103 may include a separate port 106 for dispensing a thermal interface material (TIM) 107 between the DUT 101 and the pedestal 103. A TIM is a thermally conductive material, in the form of a paste, gel, liquid, etc., that may assist in transferring or exchanging thermal energy across a mechanical interface.

Figure 1B:
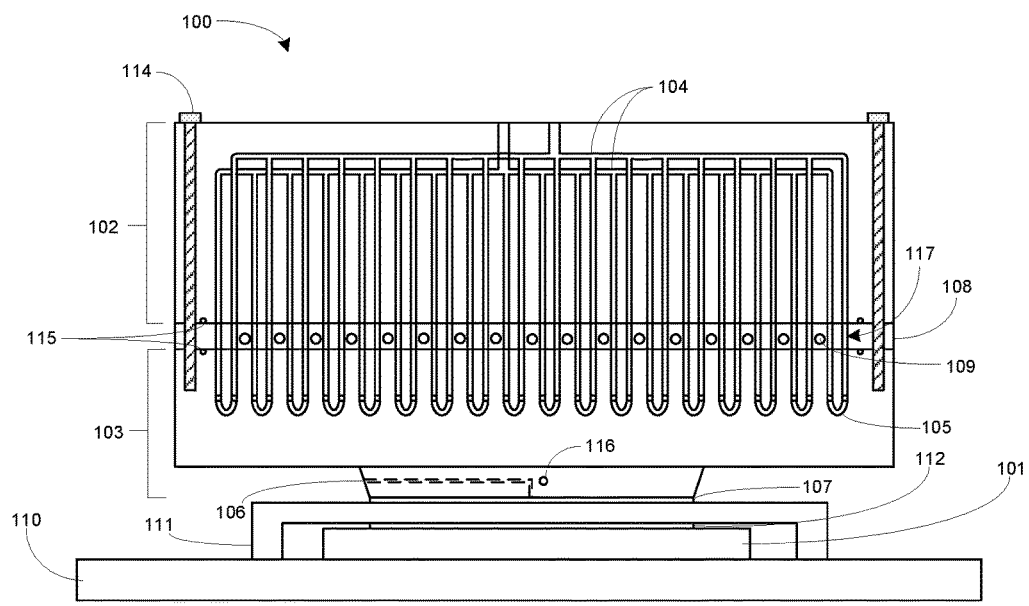

In certain examples, the DUT 101 may be mounted to a substrate such as a printed circuit board 110. In some situations, as illustrated in FIG. 1B, the DUT 101 may include an integrated heat spreader (IHS) 111. In such examples as that shown in FIG. 1B, the TIM 107 may be positioned between the pedestal 103 and the IHS 111 and a second TIM 112 may be positioned between the IHS 111 and the DUT 101. In certain examples, the channels 104, 105 of the manifold 102 and the pedestal 103 may be used to transfer thermal energy with the pedestal 103. A separate thermal device 108, such as a heat generating device, may be used to add thermal energy to the pedestal 103.

With respect to the example of FIG. 1A, the separate thermal device 108 may be a perforated heater positioned between the manifold 102 and the pedestal 103. In certain examples, the perforated heater may include a ceramic housing with perforations or openings 117 to allow the heating or cooling material within the channels 104 of the manifold 102 to flow between the manifold 102 and the channels 105 of the pedestal 103. The perforated heater may use internal electrical heating elements 109 to modulate heat transfer to the pedestal 103. In certain examples, the perforated ceramic heater can be part of the thermal head and may be universally fungible between different device types, whereas the pedestal may be the only device-specific component of this assembly. This architecture than provides an added advantage of fungible heater across multiple product form factors, saving recurring curing expense for the thermal device 108.

Figure 1C:
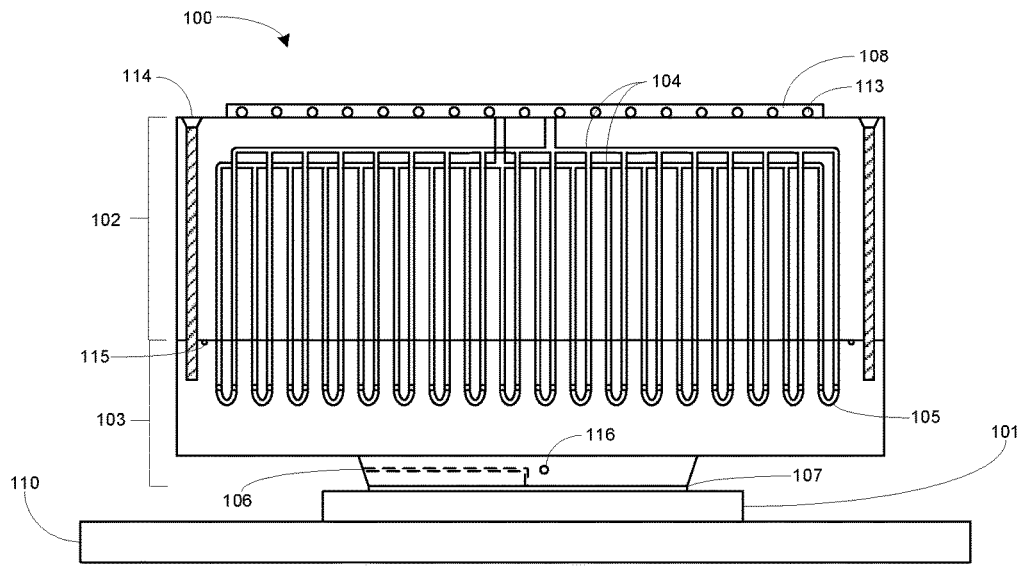

In certain examples, the pedestal 103 may include a magnetic material, such as a ferromagnetic material, and the separate thermal device 108 may include induction coils 113 such that the pedestal 103 may be heated via induction heating. Such heating allows the electrically energized coils to induce heat-creating eddy currents in the magnetic material. Induction heating may be quite efficient as the heat is generated directly in the magnetic material of the pedestal 103. In certain examples, an induction heating coil does not need to be located between the manifold 102 and the pedestal 103. In some examples, the separate thermal device 108 may include an induction coil assembly located above the manifold 102 as illustrated in FIG. 1C. When the induction coil carries an alternating current, the pedestal inductively (wirelessly) heats with very high efficiency (~90%). Use of an inductor coil may eliminate heater trace and saves the fabrication expense of embedding a heater trace in another medium. An induction coil may also reduce the number of heater-to-DUT interfaces to 1, because in this case, the induction heated pedestal is the heater. In certain examples, the manifold and the pedestal may be coupled using bolts 114 or other fasteners. In certain examples, one or more gaskets 115 may seal the channel interface between the manifold 102 and the pedestal 103

Figure 2A:
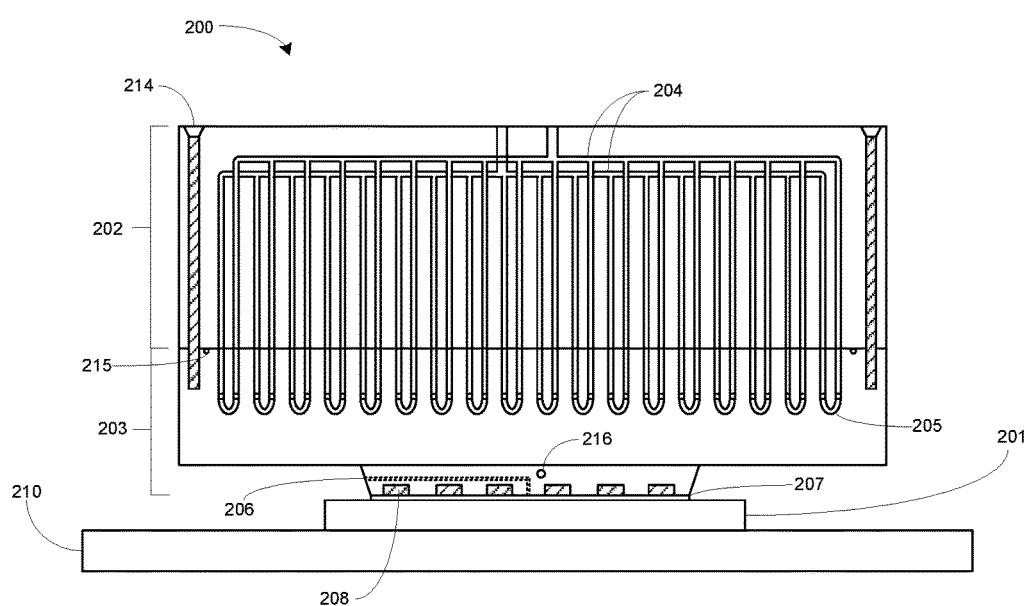
FIG. 2A illustrates generally an example system for thermal management of a DUT.

FIG. 2A illustrates generally an example system 200 for thermal management of a DUT 201. The system 200 may include a manifold 202 and a pedestal 203. The manifold 202 may include channels 204 or ports for routing heating or cooling materials. The heating and cooling materials may be used to transfer heat energy between the assembly of the manifold 202 and pedestal 203, and an external environment. The pedestal 203 may also include channels 205 or ports to route the heating or cooling materials within the interior of the pedestal 203. In certain examples, the channels 205 of the pedestal 203 may be mated to the channels 204 of the manifold 202 to enable direct thermal modulation of the pedestal 203. In certain examples, the pedestal 203 may include a temperature sensor 216. In some examples, the pedestal 203 may include multiple temperature sensors or temperature sensing elements. In some examples, the pedestal 203 may include a separate port 206 for dispensing a thermal interface material (TIM) between the DUT and the pedestal 203. A TIM may assist in transferring thermal energy across a mechanical interface. In certain examples, the DUT 201 may be mounted to a substrate such as a printed circuit board 210. In some situations, similar to the system of FIG. 1B, the DUT 201 may include an IHS, and the TIM 207 may be positioned between the pedestal 203 and the IHS, and a second TIM may be positioned between the IHS and the DUT 201. In certain examples, the manifold and the pedestal may be coupled using bolts 214. In certain examples, one or more gaskets 215 may seal the channel interface between the manifold 202 and the pedestal 203.

Figure 2B:
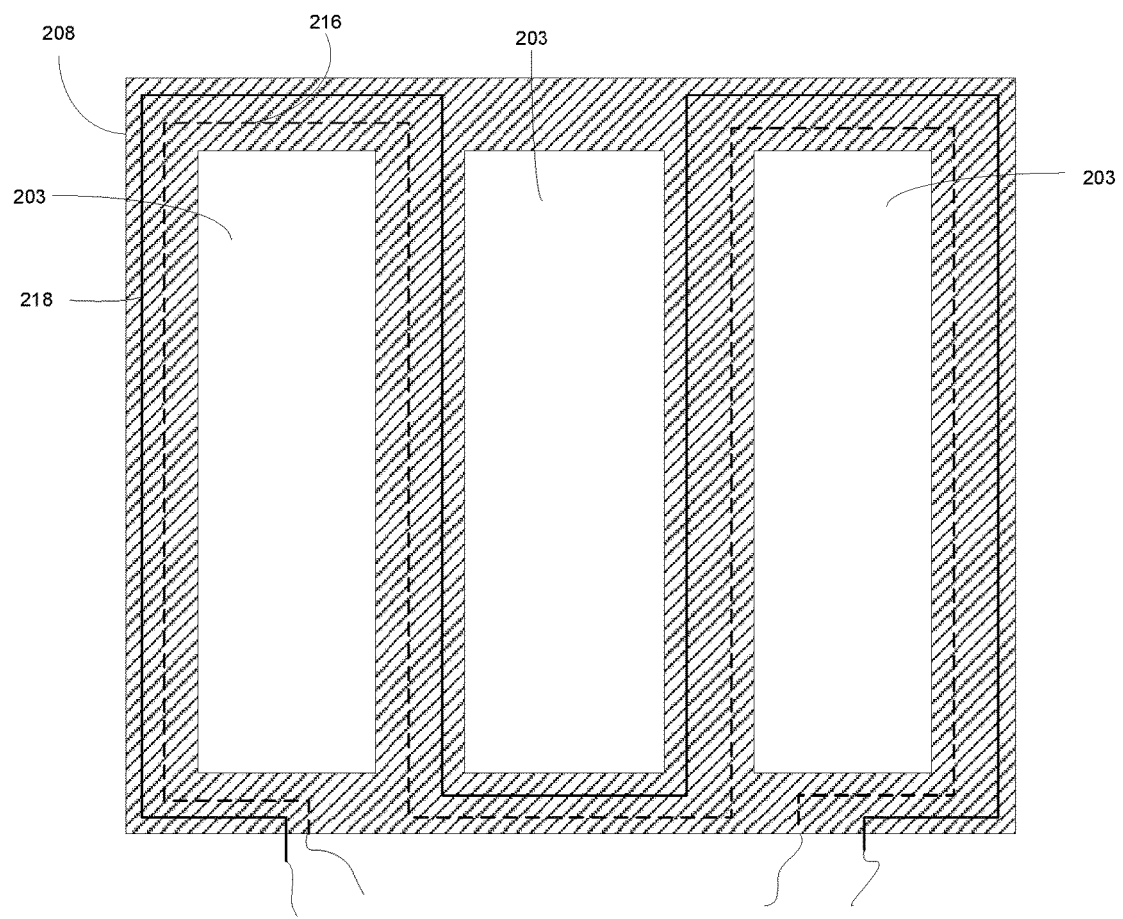
FIG. 2B illustrates generally an example pedestal with a patterned heater element.

FIG. 2B illustrates generally an underside view of the system of FIG. 2A and shows an example pedestal 203 with a patterned heater element 208. In certain examples, the pedestal 203 may include a heating element 208 that includes a patterned heater geometry that allow regions of the pedestal 203 to penetrate through the heating element 208. As such, portions of the heating element 208 may be flush with the contact surface or device-specific surface of the pedestal 203 to allow less thermal resistance between the heating element 208 and the contact surface of the DUT 201. In certain examples, the heating element 208 may include heat conductors or heat traces 218 that meander around the protruding pedestal 203. In certain examples, the integrated heating element 208 can reduce the thickness of the system 200. In certain examples, the heating element 208 may include an optional temperature sensor. In some examples, the temperature sensor may include optional sensing elements 216 that meander through the pedestal 203 with the heat traces 218. In some examples, the heating element 208 includes a ceramic housing or a housing including aluminum nitride.

In certain examples, the shorter thermal path between the fluid and the DUT may result in an advantage in thermal resistance (despite the high resistance of the ceramic heater). The performance of the parallel heater solution illustrated in FIGS. 2A and 2B can favor DUT silicon junction temperature rise vs. droop performance as a function of the effective heater-to-pedestal area. In the configuration modeled, such as with 48% heater area, the parallel heater solution has a faster recovery time—and a reduced droop-on the heat-up recovery compared to the baseline technology. IN certain examples, reducing the effective heater area ratio my provide benefits that lean towards the DUT silicon junction temperature rise side.

Figure 3A:
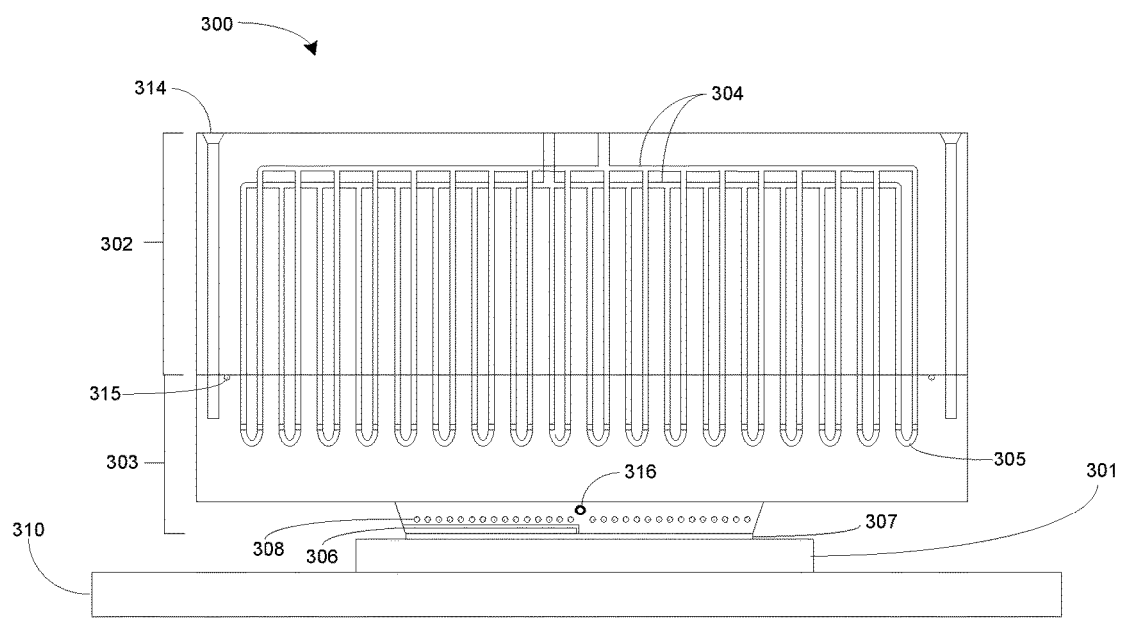
FIG. 3A illustrates generally an example system for thermal management of a DUT including a metal integrated heating element.

FIG. 3A illustrates generally an example system 300 for thermal management of a DUT 301. The system 300 may include a manifold 302 and a pedestal 303. The manifold 302 may include channels 304 or ports for routing heating or cooling materials. The heating and cooling materials may be used to transfer heat energy between the assembly of the manifold 302 and pedestal 303, and an external environment. The pedestal 303 may also include channels 305 or ports to route the heating or cooling materials within the interior of the pedestal 303. In certain examples, the channels 305 of the pedestal 303 may be mated to the channels 304 of the manifold 302 to enable direct thermal modulation of the pedestal 303. In certain examples, the pedestal 303 may include a temperature sensor 316. In some examples, the pedestal 303 may include multiple temperature sensors or temperature sensing elements. In some examples, the pedestal 303 may include a separate port 306 for dispensing a thermal interface material (TIM) between the DUT and the pedestal 303. A TIM may assist in transferring thermal energy across a mechanical interface. In certain examples, the DUT 301 may be mounted to a substrate such as a printed circuit board 310. In some situations, similar to the system of FIG. 1B, the DUT 301 may include an integrated heat spreader (IHS), and the TIM 307 may be positioned between the pedestal 303 and the IHS, and a second TIM may be positioned between the IHS and the DUT 301. In certain examples, the manifold and the pedestal may be coupled using bolts 314. In certain examples, one or more gaskets 315 may seal the channel interface between the manifold 302 and the pedestal 303. In certain examples, the pedestal 303 may include directly embedded heat-able traces or heater wire traces 308. Such a pedestal can reduce thickness of the system 300 and reduce interface resistance. Compared to conventional systems, the system 300 may reduce thermo-mechanical interfaces to 1 within the fluid-to-DUT, or heater-to-DUT stack-up. In addition, the system 300 can provide higher thermal conductivity host material (copper) for heater trace, for example compared to ceramic, and is less expensive to produce than conventional systems. In certain example, the system can provide approximately 20% lower thermal resistance.

Figure 3B:
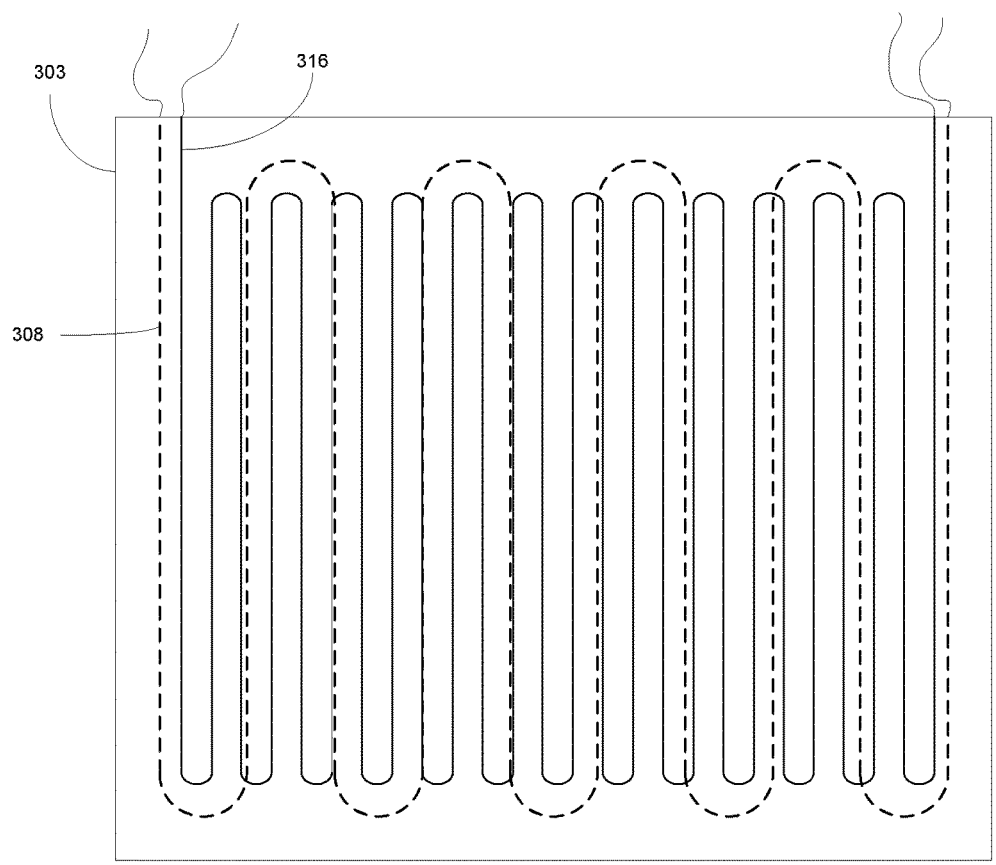
FIG. 3B illustrates a top-view cross section of the pedestal showing an example path of an embedded heater wire trace and an example path of an optional resistance temperature detector (RTD) trace.

In certain examples, the pedestal 303 may be made of a low thermal inertia material such as copper and the heater wire traces 308 may be embedded in the copper by using spark plasma sintering process discussed below. In certain examples, a temperature sensor or temperature sensor element such as a resistance temperature detector (RTD) 316 may be fabricated within the pedestal 303. In some examples, an RTD 316 may include a smaller gauge trace of the same material used for the heater wire traces 308. FIG. 3B illustrates a top-view cross section of the pedestal showing an example path of a heater wire trace 308 and an example path of an RTD 316 trace. In certain examples, the information provided by the RTD 316 may be used to control the heating and cooling of the pedestal 303 while a device is under test. It is understood that other patterns for routing the heater wire traces 308 and the RTD 316 trace are possible without departing from the present subject matter.

FIGS. 4A and 4B-4K illustrate generally an example method 400 for making at least a portion of a pedestal with embedded heating traces as discussed above with respect to the examples of FIGS. 3A and 3B. At 401, the heating conductor, or core, of the heating trace or the sensing conductor of the RTD trace may be bent and shaped into a desired pattern or route. In certain examples, the core may include a nickel-chromium wire. In certain examples, the wire pattern may be created by chemically etching a pattern into a sheet of metal, such as nickel-chromium, which may yield a more accurate and consistent pattern. In certain examples, excess wire may be trimmed from the pattern and leads may be arc welded to the core to provide a coated core 421. In certain examples, lead material with high thermal conductivity and high meting point (e.g., above 1000° C.) are selected. At 403, the shaped core may be insulated. In certain examples, the insulation can be fabricated by processes including, but not limited to, oxidation, chemical vapor deposition, electroless plating, spray coating, casting, or combinations thereof. In an example, oxidation may be achieved by heating the wire for example to about 1000° C. for 30 seconds or so. In certain examples, fabrication of an insulator for the shaped core may include application of a nitride layer, a sulfide layer, silica-glass layer, other insulating layer materials, or combinations thereof, or in combination with methods described above with respect to insulating the shaped core at 403. In certain examples, boron nitride or other insulating material may be applied in two or more spray applications to form a continuous coating on the shaped core or the coated core 421 for electrical resistance.

Figure 4A:
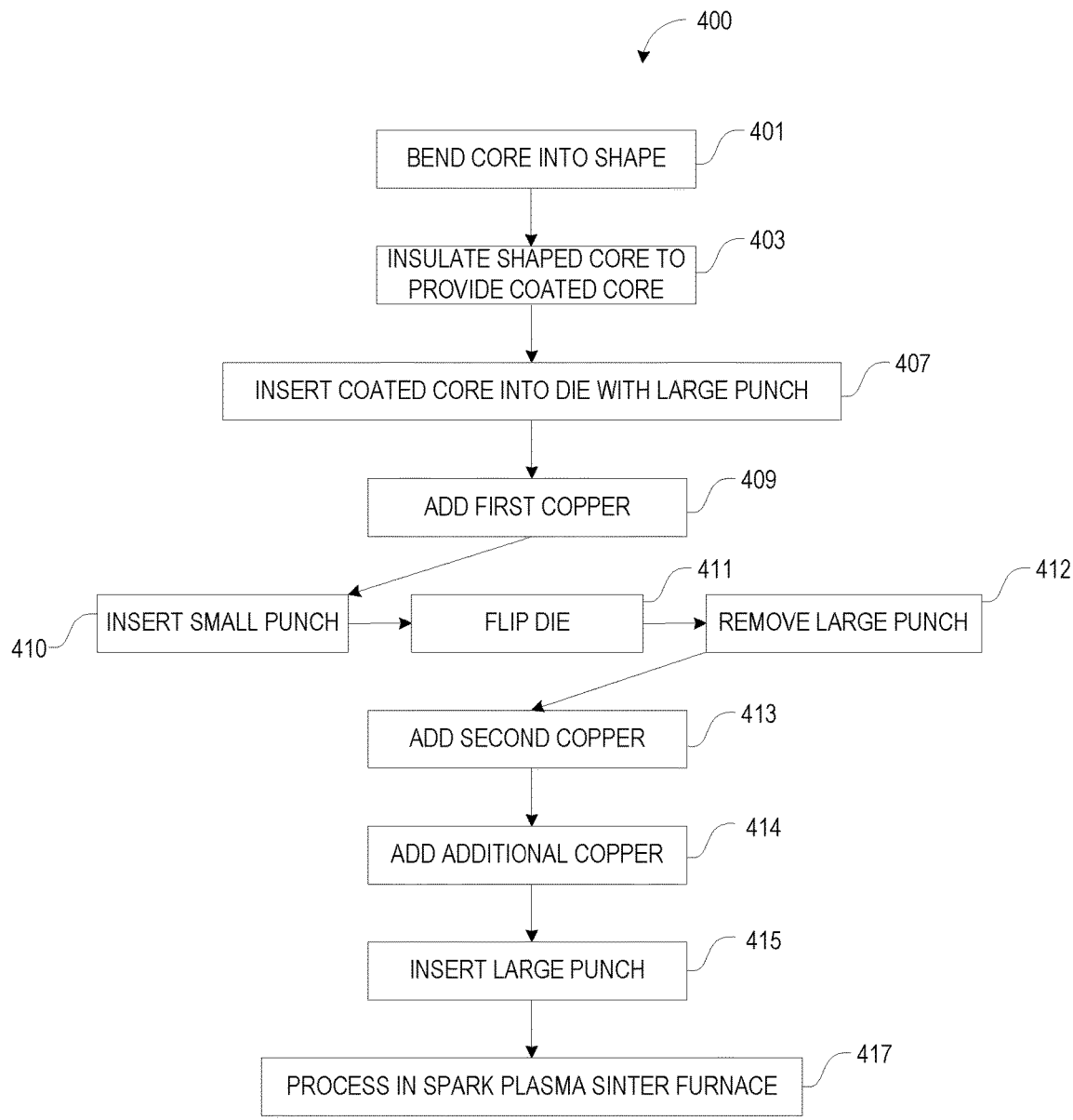
FIG. 4A illustrate generally a flowchart of an example method for making at least a portion of a pedestal with embedded heating traces.
Figure 4B:
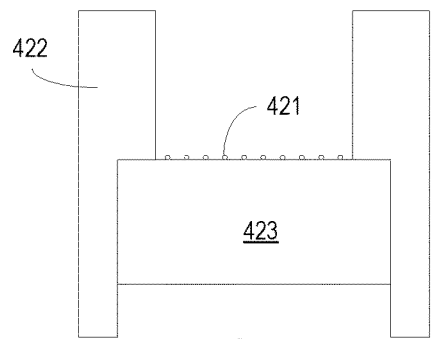
FIGS. 4B-4K illustrate graphically an example method for making at least a portion of a pedestal with embedded heating traces.
Figure 4C:
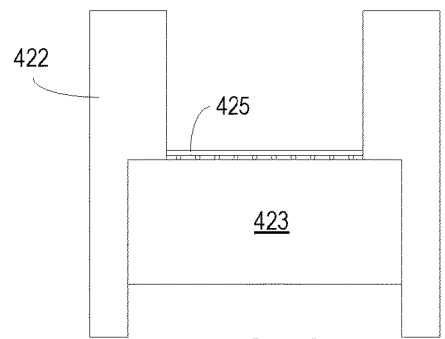
Figure 4D:
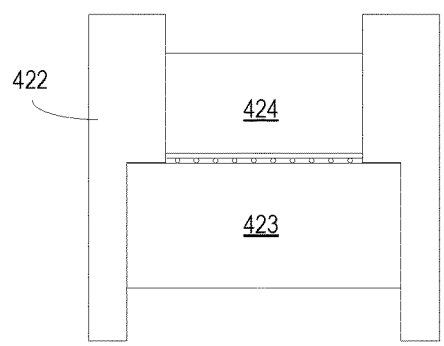
Figure 4E:
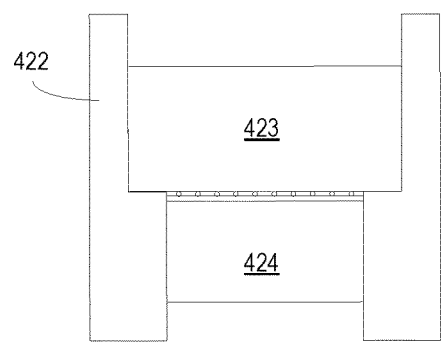
Figure 4F:
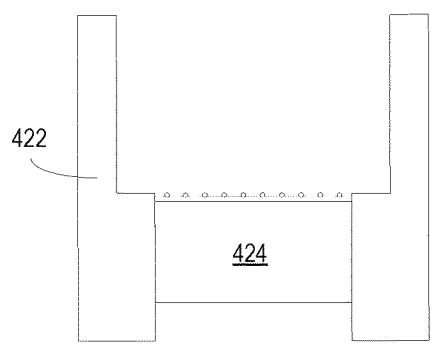
Figure 4G:
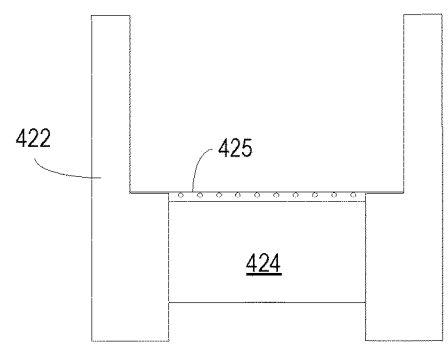
Figure 4H:
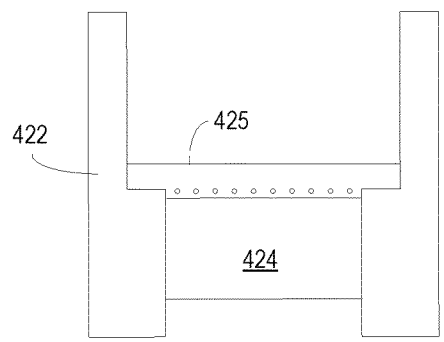
Figure 4I:
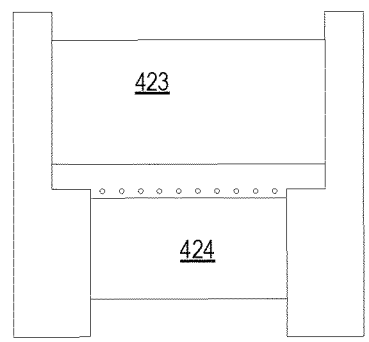
Figure 4J:
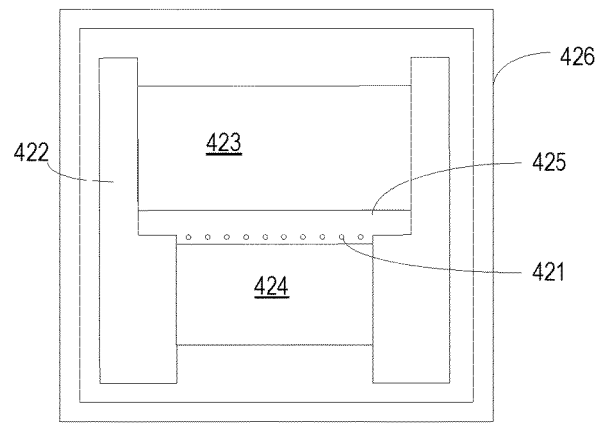
Figure 4K:
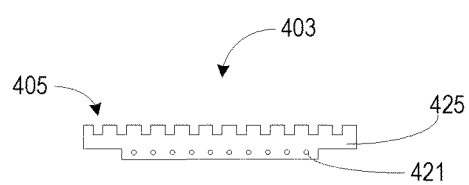

At 407 (FIG. 4B), the coated core 421 may be placed in a die 422 that may accept a large punch 423 and a small punch 424. In certain examples, the die or the punches may be formed using graphite. The coated core 421 may be inserted into the die via the small punch access and placed on the large punch 423. Ends of the core or the leads may be threaded through holes in the die 422 from the core to the outside of the die 422. At 409 (FIG. 4C), a first copper powder 425 may be added to the die to cover the coated core 421. At 410 (FIG. 4D), the small punch 424 may be inserted into the die 422. At 411 (FIG. 4E), the die 422 may be flipped. At 412 (FIG. 4F), the large punch 423 may be removed. In certain examples, upon inserting the small punch 424, at 410, pressure may be applied to squeeze the copper and the coated core between the large punch 423 and the small punch 424 which may flatten and compact the copper powder. At 413 (FIG. 4G), upon removal of the large punch 423 a second quantity of copper powder 425 may be added to fill various gaps and regions in the layer occupied by the coated core 421. At 414 (FIG. 4H), additional quantities of copper powder 425 may be added to build up the thickness of the pedestal. In certain examples, the copper powder 425 may be added, compressed and flattened in cycles as the thickness of the pedestal is built up. At 415 (FIG. 4I), the large punch 423 may be inserted into the die 422. At 417 (FIG. 4J), the die assembly may be placed in a spark plasma sintering furnace 426 and the assembly may be processed. In certain examples, pressure is applied to the punches 423, 424 to squeeze the coated core 421 and copper 425 while simultaneously with heating the furnace and placing the assembly under vacuum. In some examples, the furnace 426 is heated at a steady rate to a predefined temperature, held at the predefined temperature for a hold time and then cooled. In certain examples, the rate of heating may be about 100 C/min, the predefined temperature may be 700 C and the hold time may be about 5 minutes. In certain examples, electricity is applied to the copper powder inside the die for self-heating and raising the temperature of the copper significantly beyond 700 C, which may complete the spark plasma sintering process. Upon cooling, the coated wire and copper assembly may be sanded, polished, lapped, milled or a combination thereof. In certain examples, the small punch area of the coated core and copper assembly may be milled to form a pedestal surface having a size and shape of a target device. In some examples, channels 405 may be milled into the large punch area of the coated core and copper assembly 403 to form the heating and cooling channels discussed with respect to FIGS. 1A-1C, 2, 3A and 3B. FIG. 4K illustrates an example pedestal 403 with the milled channels 405.

In certain examples, a pattern of coated RTD core may be positioned in the die during the build-up of the pedestal. After the addition of the coated RTD core, additional quantities of copper powder or additional cycles of copper powder addition, compression and flattening may be completed to build up the thickness of the pedestal. FIG. 3B also illustrates an example pattern of heating elements and temperature sensing elements that may be formed using the above fabrication method. It is understood that other patterns are possible without departing from the scope of the present subject matter.

Figure 5:
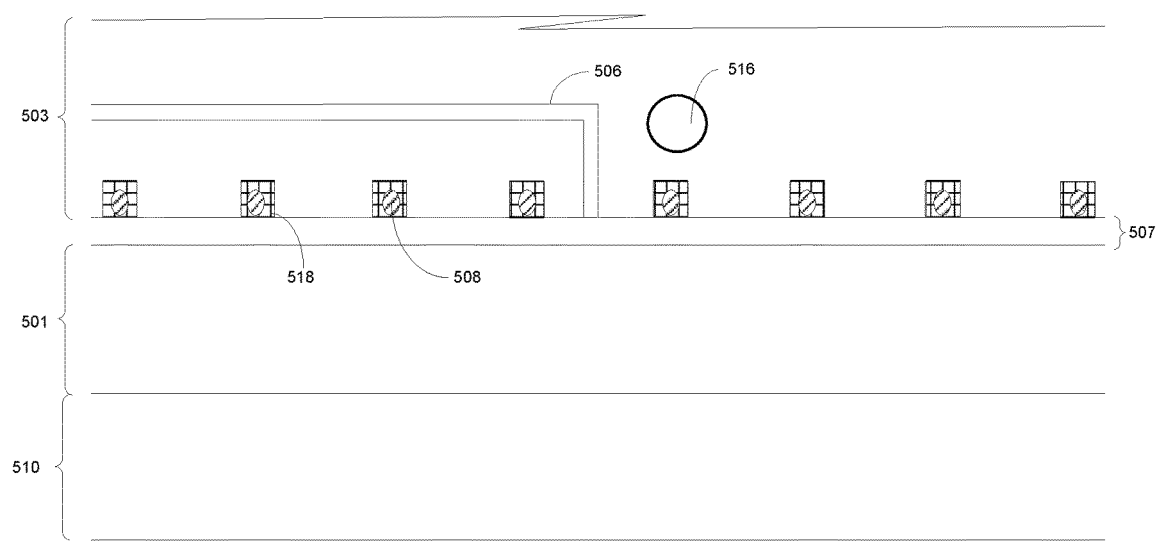
FIG. 5 illustrates generally a close-up view of an example pedestal with a surface embedded integrated heater.

FIG. 5 illustrates generally a close-up view of a pedestal interface including a surface embedded insulated heater. The pedestal interface shows a portion of the pedestal 503, a layer of temperature interface material (TIM) 507, a portion of the DUT 501 and a portion of a substrate 510. In some examples, the pedestal 503 may include a port 506 for dispensing the TIM 507 between the DUT 501 and the pedestal 503. In certain examples, heater wire traces 508 of the surface embedded insulated heater may be integrated within channels of the pedestal 503 and with a thermally insulating fill 518 near or at the interface of the pedestal 503 with the DUT 501, or with an integrated heat spreader (IHS). In certain examples, the thermally insulating fill may include organic thermally insulating material such as epoxy, as well as, inorganic thermally insulating material. By having the heater trace 508 touch the DUT 501 (intimate contact) but thermally insulated from the pedestal 503 via the thermally insulating fill 518, the heater may have a temporally preferential heat-flow path toward the DUT 501 and may heat the DUT 501 more quickly. In certain examples, the pedestal may include an optional temperature sensor 316. In certain examples, the temperature sensor may include sensing elements that meander through the pedestal 503 in a pattern such as that shown in FIG. 3B. It is understood that other patterns are possible without departing from the scope of the present subject matter.

Figure 6:
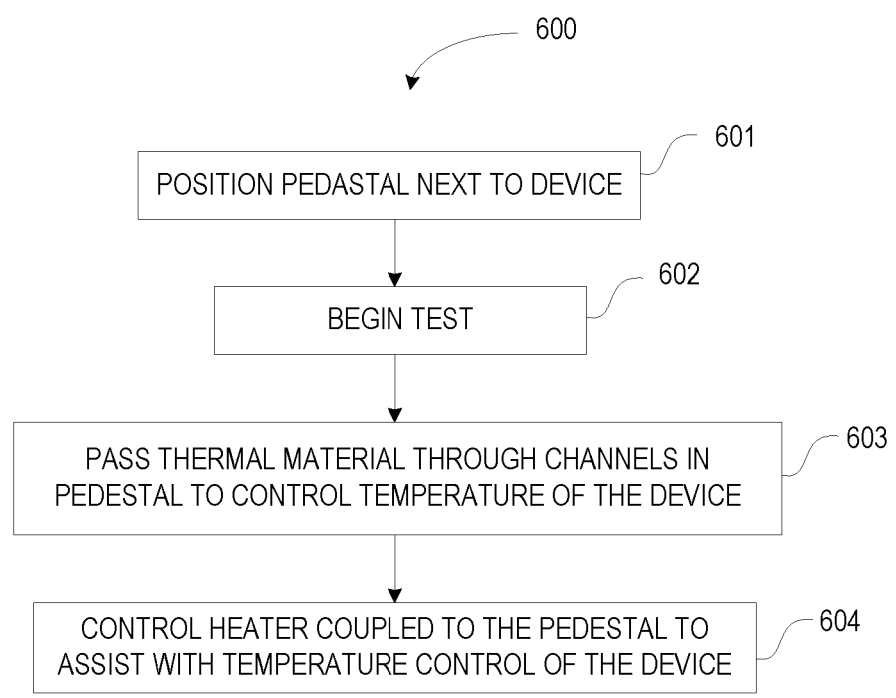
FIG. 6 illustrates generally a flowchart of an example method of operating a pedestal according to various examples of the present subject matter.

FIG. 6 illustrates generally an example method 600 of operating a pedestal according to various examples of the present subject matter. At 601, the pedestal may be positioned adjacent the device to be tested. In certain examples, a surface of the pedestal contacts a coextensive surface of the device. In some examples, the pedestal is positioned with a gap between the pedestal and the device and a thermal transfer material is dispensed to fill the gap. In some examples, the thermal transfer material is dispensed through a port of the pedestal. In certain examples, the surface of the device the pedestal is positioned adjacent to may be a surface of a device cap or integrated heat spreader (IHS). At 602, the device test is initiated. In certain examples, the test is designed to significantly, electrically load the device and, as such, the device may generate significant temperature swings. At 603, thermal material, for example, from a heat source or a heat sink, may be circulated through the pedestal. In conventional pedestals, thermal materials are circulated in a manifold adjacent the pedestal but are not circulated within the pedestal. At 604, a heater may be employed to assist in controlling the temperature of a device. In some examples, the heater may be located between the manifold and the pedestal, and may include openings or vias to pass the thermal material between the manifold and the pedestal. In some examples, the heater may be an inductive heater that may be located remote from the pedestal but may heat the ferrous metal of the pedestal via induced eddy currents within the pedestal material. In certain examples, the heater may be integrated with the pedestal at or near the pedestal surface positioned adjacent the device. In certain example, the heater may be patterned in ceramic or epoxy and flush-mounted into the surface trenches of the pedestal.

Additional Examples and Notes

In Example 1, an apparatus for temperature control of an integrated circuit under test can include a pedestal having a device-specific surface configured to exchange heat with the integrated circuit while the device-specific surface is in contact with a surface of the integrated circuit or separated from the surface of the integrated circuit by a layer of thermally conductive material, a heat generating element configured to heat the device-specific surface, and wherein the pedestal includes a plurality of channels configured to couple to a manifold and to route thermal material from the manifold through an interior of the pedestal for maintaining temperature control of the surface of the integrated circuit.

In Example 2, the heat generating element of Example 1 optionally is integrated within the pedestal closer to the device-specific surface of the pedestal than to a second surface of the pedestal, the second surface opposite the device-specific surface and configured to couple with the manifold.

In Example 3, the heat generating element of any one or more of Examples 1-2 optionally includes a heat-able trace arranged in a meandering pattern that defines a plane parallel to the device-specific surface.

In Example 4, the heat-able trace of any one or more of Examples 1-3 optionally includes a nickel-chromium core.

In Example 5, the heat-able trace of any one or more of Examples 1-4 optionally includes an oxide material surrounding the nickel-chromium core.

In example 6, the heat-able trace of any one or more of Examples 1-5 optionally includes a boron nitride material surrounding the nickel-chromium core.

In Example 7, the apparatus of any one or more of Examples 1-6 optionally includes a temperature sensor such as a thermocouple integrated within the pedestal proximate the device-specific surface.

In Example 8, the temperature sensor of any one or more of Examples 1-7 optionally includes a sensing element, such as an RTD that is arranged to meander within the pedestal with the heat generating element.

In Example 9, the temperature sensor of any one or more of Examples 1-8 optionally includes a sensing element that is arranged to meander within the pedestal along a path that is different than the meandering pattern of the heat-able trace.

In Example 10, the temperature sensor of any one or more of Examples 1-9 optionally includes a sensing element, wherein the sensing element includes a nickel-chromium core.

In Example 11, the temperature sensor of any one or more of Examples 1-10 optionally includes a sensing element, wherein the sensing element includes an oxide surrounding the nickel-chromium core.

In Example 12, the heat-able trace of any one or more of Examples 1-11 optionally includes a Boron Nitride or other insulating ceramic material surrounding the nickel-chromium core.

In Example 13, the apparatus of any one or more of Examples 1-12 optionally includes a temperature sensor integrated within the pedestal proximate the device-specific surface.

In Example 14, the device-specific pedestal of any one or more of Examples 1-13 optionally includes a device-specific surface configured to contact or be placed adjacent the integrated circuit during a test and the heat generating element is optionally configured to form a second surface of the pedestal, the second surface opposite the device-specific surface.

In Example 15, the heat generating element of any one or more of Examples 1-14 optionally includes a ceramic exterior.

In Example 16, the heat generating element of any one or more of Examples 1-15 optionally includes a plurality of openings, the plurality of openings configured to couple the channels with the manifold.

In Example 17, the heat generating element of any one or more of Examples 1-16 optionally is an inductive heating element configured to induce heating of the pedestal.

In Example 18, the pedestal of any one or more of Examples 1-17 optionally is a copper pedestal, or non-metallic highly thermally conductive materials like graphite, graphene.

In Example 19, a method for thermal management of an integrated circuit device under test can include positioning a pedestal next to the integrated circuit device, initiating the test of the integrated circuit device, passing thermal material through channels of the pedestal, and exchanging flow of the thermal materials with a manifold coupled to the pedestal to maintain a thermal condition of the integrated circuit device.

In Example 20, the method of any one or more of Examples 1-19 optionally includes controlling a heater coupled to the pedestal to assist with temperature control of the integrated circuit device.

In Example 21, the controlling a heater of any one or more of Examples 1-20 optionally includes controlling an inductive heating coil.

In Example 22, the controlling a heater of any one or more of Examples 1-21 optionally includes controlling a heater positioned between the manifold and the pedestal.

In Example 23, the controlling a heater of any one or more of Examples 1-22 optionally includes controlling heating wire traces integrated with the pedestal.

The above detailed description includes references to the accompanying drawings, which form a part of the detailed description. The drawings show, by way of illustration, specific embodiments in which the subject matter may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments may be combined with each other in various combinations or permutations. The scope of the present subject matter should be determined with reference to the appended claims, along with the full scope of equivalents to which such claims are legally entitled.

What is claimed is:

1. An apparatus for temperature control of an integrated circuit under test, the apparatus comprising:
   a pedestal having a device-specific surface configured to exchange heat with the integrated circuit while the device-specific surface is in contact with a surface of the integrated circuit or separated from the surface of the integrated circuit by a layer of thermally conductive material;
   a heat generating element configured to heat the device-specific surface;
   wherein the pedestal includes a plurality of channels configured to couple to a manifold and to route thermal material from the manifold through an interior of the pedestal for maintaining temperature control of the surface of the integrated circuit; and
   wherein the heat generating element is integrated within the pedestal closer to the device-specific surface of the pedestal than to a second surface of the pedestal, the second surface opposite the device-specific surface and configured to couple with the manifold.

2. The apparatus of claim 1, wherein the heat generating element includes a heat-able trace arranged in a pattern that defines a plane parallel to the device-specific surface.

3. The apparatus of claim 2, wherein the heat-able trace includes a nickel-chromium core.

4. The apparatus of claim 2, wherein the heat-able trace includes an oxide material surrounding the nickel-chromium core.

5. The apparatus of claim 2, wherein the heat-able trace includes a boron nitride material surrounding the nickel-chromium core.

6. The apparatus of claim 2 including a temperature sensor integrated within the pedestal proximate the device-specific surface.

7. The apparatus of claim 2, including a temperature sensor integrated within the pedestal proximate the device-specific surface.

8. The apparatus of claim 7, wherein the temperature sensor includes a sensing element that is arranged to follow within the pedestal with the heat generating element.

9. The apparatus of claim 8, wherein the temperature sensor includes a sensing element that is arranged to follow within the pedestal along a path that is different than the pattern of the heat-able trace.

10. The apparatus of claim 7, wherein the temperature sensor includes a sensing element, wherein the sensing element includes a nickel-chromium core.

11. The apparatus of claim 10, wherein the temperature sensor includes a sensing element, wherein the sensing element includes a oxide surrounding the nickel-chromium core.

12. The apparatus of claim 10, wherein the heat-able trace includes a Boron Nitride material surrounding the nickel-chromium core.

13. The apparatus of claim 1, wherein the heat generating element is an inductive heating element configured to induce heating of the pedestal.

14. The apparatus of claim 1, wherein the pedestal is a copper pedestal.

15. A method for thermal management of an integrated circuit device under test, the method comprising:
passing thermal material through channels of the pedestal;
exchanging flow of the thermal materials with a manifold coupled to the pedestal to maintain a thermal condition of the integrated circuit device;
controlling a heater of the pedestal to assist with temperature control of the integrated circuit device;
wherein the heater is located within said pedestal closer to a device specific surface of the pedestal than to the manifold; and
wherein the device specific surface is configured to exchange heat with the integrated circuit device while the device-specific surface is in contact with a surface of the integrated circuit device or is separated from the surface of the integrated circuit device by a layer of thermally conductive material.

16. The method of claim 15, wherein the controlling a heater includes controlling heating wire traces integrated with the pedestal.

\* \* \* \* \*